(12) United States Patent
Jiang et al.

(10) Patent No.: US 7,973,295 B2
(45) Date of Patent: Jul. 5, 2011

(54) METHOD FOR MAKING TRANSPARENT CARBON NANOTUBE FILM

(75) Inventors: Kai-Li Jiang, Beijing (CN); Liang Liu, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 155 days.

(21) Appl. No.: 12/284,083

(22) Filed: Sep. 18, 2008

(65) Prior Publication Data
US 2009/0289203 A1    Nov. 26, 2009

(30) Foreign Application Priority Data

May 23, 2008    (CN) .......................... 2008 1 0067426

(51) Int. Cl.
*A61N 5/00*   (2006.01)
*A61N 5/067*  (2006.01)

(52) U.S. Cl. .................. 250/492.1; 428/299.1; 428/298; 977/742; 423/445; 423/447.1; 156/345.24

(58) Field of Classification Search ............... 250/492.1; 977/742; 423/445 R, 447.1; 428/299.1, 428/298.1
See application file for complete search history.

(56) References Cited

U.S. PATENT DOCUMENTS

| | | | |
|---|---|---|---|
| 7,060,241 B2 * | 6/2006 | Glatkowski | 423/447.1 |
| 2009/0267000 A1 * | 10/2009 | Chen et al. | 250/492.1 |
| 2009/0268557 A1 * | 10/2009 | Jiang et al. | 367/140 |

* cited by examiner

*Primary Examiner* — Nikita Wells
(74) *Attorney, Agent, or Firm* — D. Austin Bonderer

(57) ABSTRACT

The present method relates to a method for making a transparent carbon nanotube film. The method includes the following steps: (a) making a carbon nanotube film, and (b) irradiating the carbon nanotube film by a laser device with a power density thereof being greater than $0.1 \times 10^4$ W/m$^2$, thus acquiring the transparent carbon nanotube film.

19 Claims, 6 Drawing Sheets

--- making a carbon nanotube film

↓ irradiating the carbon nanotube film by a mobile laser device with a power density being greater than $0.1 \times 10^4$ W/m$^2$, thus acquiring a transparent carbon nanotube film making a carbon nanotube film irradiating the carbon nanotube film by a mobile laser device with a power density being greater than $0.1 \times 10^4$ W/m$^2$, thus acquiring a transparent carbon nanotube film

FIG. 1

METHOD FOR MAKING TRANSPARENT CARBON NANOTUBE FILM

RELATED APPLICATIONS

This application is related to commonly-assigned applications entitled, "METHOD FOR MAKING A CARBON NANOTUBE FILM", filed on Dec. 28, 2007, with a U.S. patent application Ser. No. 12/005,828 ; "METHOD FOR MAKING A CARBON NANOTUBE FILM", filed on Dec. 20, 2007, with a U.S. patent application Ser. No. 12/004,673; and "CARBON NANOTUBE FILM STRUCTURE AND METHOD FOR FABRICATING THE SAME", filed on Dec. 14, 2007, with a U.S. patent application Ser. No. 12/002,129. The disclosures of the above-identified applications are incorporated herein by reference.

BACKGROUND

1. Field of the Invention

The present invention relates to a method for making a transparent carbon nanotube film.

2. Discussion of Related Art

Carbon nanotubes have been well known for their special properties ever since they've been discovered. Many potential applications have been proposed for carbon nanotubes, including conductive and high-strength composites, energy storage and energy conversion devices, sensors, field emission displays, and nanometer-sized semiconductor devices, referring to "Carbon Nanotubes-the Route Toward Applications" (Science, 297, 787 (2002)).

Carbon nanotube film has been found to be especially useful in field emission electron sources, photoelectric and biological sensors, transparent electrical conductors, battery electrodes, absorbing materials, water purification materials, light emitting material, and related devices. Thus, methods for making carbon nanotube films have become the basis for applications in the above-described fields. Currently, carbon nanotube films can be made via a method of direct growth.

Carbon nanotube film can also be made by methods using carbon nanotube powders, such as a dropping and drying solvent method, a Langmuir-Blodgett (L-B) method, a printing method, an electrophoresis method, and a membrane filter method, among other methods. Carbon nanotube film can also be pulled out from super-aligned carbon nanotube arrays and the carbon nanotubes in the carbon nanotube film are aligned in parallel to each other and combined together by van der Waals attractive force therebetween.

The carbon nanotubes in the carbon nanotube films made by above-described methods are typically in the form of big bundles. Thus, a light transmittance of the carbon nanotube films is less than 75%.

What is needed, therefore, is a method for making a transparent carbon nanotube film with high light transmittance.

SUMMARY

In one embodiment, a method for making a transparent carbon nanotube film includes the following steps: (a) obtaining a carbon nanotube film, and (b) irradiating the carbon nanotube film by a laser device with a power density being greater than $0.1 \times 10^4$ W/m$^2$, thus acquiring the transparent carbon nanotube film.

Other advantages and novel features of the present method for making a transparent carbon nanotube film will become more apparent from the following detailed description of presents embodiments when taken in conjunction with the accompanying drawings.

BRIEF DESCRIPTION OF THE DRAWINGS

Many aspects of the present method for making a transparent carbon nanotube film can be better understood with references to the following drawings. The components in the drawings are not necessarily drawn to scale, the emphasis instead being placed upon clearly illustrating the principles of the present method for making a carbon transparent nanotube film.

FIG. 1 is a flow chart of a method for making a transparent carbon nanotube film in accordance with a first embodiment and a second embodiment.

Figure 2:
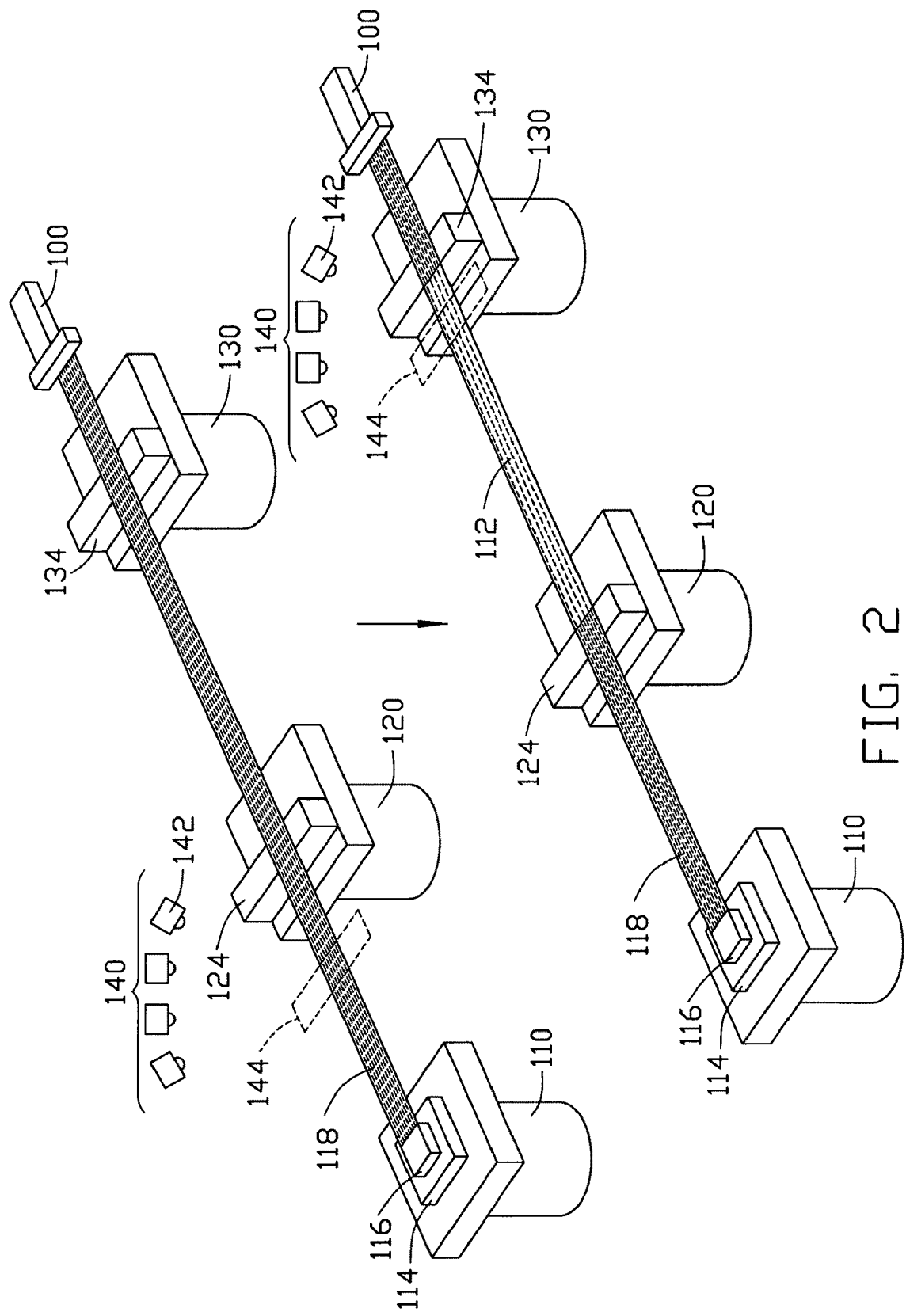
FIG. 2 is a system for making a transparent carbon nanotube film in accordance with the first embodiment.

Corresponding reference characters indicate corresponding parts throughout the several views. The exemplifications set out herein illustrate at least one embodiment of the present method for making a transparent carbon nanotube film, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present method for making a transparent carbon nanotube film.

Referring to FIG. 1, a method for making a transparent carbon nanotube film includes the following steps: (a) obtaining a carbon nanotube film; and (b) irradiating the carbon nanotube film by a laser device with a power density being greater than $0.1 \times 10^4$ W/m$^2$, thus acquiring a transparent carbon nanotube film.

In step (a), the method for obtaining a carbon nanotube film includes a direct growth method, a flocculating method, a pressing method or a pulling method.

The direct growth method is a method for obtaining carbon nanotube films on a substrate by direct growth.

The flocculating method for obtaining a carbon nanotube film includes the following steps: adding a plurality of carbon nanotubes to a solvent to create a carbon nanotube floccule structure in the solvent; separating the carbon nanotube floccule structure from the solvent; and shaping the separated carbon nanotube floccule structure into the carbon nanotube film. The carbon nanotube film made by the flocculating method includes a plurality of isotropic carbon nanotubes twisted with each other and disorderly distributed therein.

The pressing method for obtaining a carbon nanotube film includes the following steps: forming an array of carbon nanotubes on a substrate; and pressing the array of carbon nanotubes using a compressing apparatus, thereby forming a carbon nanotube film. The carbon nanotube film made by the pressing method includes a plurality of carbon nanotubes aligned in one or more directions.

In the present embodiment, the pulling method is adopted to make the carbon nanotube film.

Referring to FIG. 2, in step (a), the method for obtaining a carbon nanotube film by the pulling method includes the following substeps: (a1) providing a carbon nanotube array 116, specifically, a super-aligned carbon nanotube array 116, on a substrate 114; and (a2) pulling out a carbon nanotube film 118 from the carbon nanotube array 116 with a pulling tool 100 (e.g., adhesive tape, pliers, tweezers, or another tool allowing multiple carbon nanotubes to be gripped and pulled simultaneously).

In step (a1), the method for making a super-aligned carbon nanotube array 116 on a substrate 114 includes the following substeps: (a11) providing a substantially flat and smooth substrate; (a12) forming a catalyst layer on the substrate 114; (a13) annealing the substrate 114 with the catalyst layer thereon at a temperature ranging from 700° C. to 900° C. in air for about 30 to 90 minutes; (a14) heating the substrate 114 with the catalyst at a temperature ranging from 500° C. to 740° C. in a furnace with a protective gas therein; and (a15) supplying a carbon source gas into the furnace for about 5 to 30 minutes and growing a super-aligned carbon nanotube array 116 from the substrate 114.

In step (a11), the substrate 114 can be a P-type silicon wafer, an N-type silicon wafer, or a silicon wafer with a film of silicon dioxide thereon. A 4-inch P-type silicon wafer is used as the substrate 114 of the present embodiment.

In step (a12), the catalyst can be made of iron (Fe), cobalt (Co), nickel (Ni), or any alloy thereof.

In step (a14), the protective gas can be made up of at least one of nitrogen ($N_2$), ammonia ($NH_3$), and a noble gas. In step (a15), the carbon source gas can be a hydrocarbon gas, such as ethylene ($C_2H_4$), methane ($CH_4$), acetylene ($C_2H_2$), ethane ($C_2H_6$), or any combination thereof.

The super-aligned carbon nanotube array 116 can be approximately 200 to 400 microns in height and includes a plurality of carbon nanotubes parallel to each other and substantially perpendicular to the substrate 114. The super-aligned carbon nanotube array 116 formed under the above conditions is essentially free of impurities, such as carbonaceous or residual catalyst particles. The carbon nanotubes in the super-aligned carbon nanotube array 116 are packed together closely by van der Waals attractive force.

In the present embodiment, the substrate 114 is fixed on a sample platform 110 by an adhesive tape or a binding admixture. Alternatively, the substrate 114 is mechanically fixed on a sample platform 110.

In step (a2), the carbon nanotube film 118 can be formed by the following substeps: (a21) selecting a plurality of carbon nanotubes having a predetermined width from the super-aligned carbon nanotube array 116, binding the carbon nanotubes to the pulling tool 100; and (a22) pulling the carbon nanotubes at an even/uniform speed to achieve the carbon nanotube film 118.

In step (a21), the carbon nanotubes having a predetermined width can be selected by using a wide adhesive tape as the tool to contact the super-aligned carbon nanotube array 116. In step (a22), the pulling direction is substantially perpendicular to the growing direction of the super-aligned carbon nanotube array 116.

During the pulling process, initial carbon nanotube segments are drawn out, other carbon nanotube segments are also drawn out end-to-end due to the van der Waals attractive force between ends of adjacent segments. This process of drawing ensures a successive carbon nanotube film 118 can be formed. The carbon nanotubes of the carbon nanotube film 118 are all substantially parallel to the pulling direction and connected end-to-end.

Figure 3:
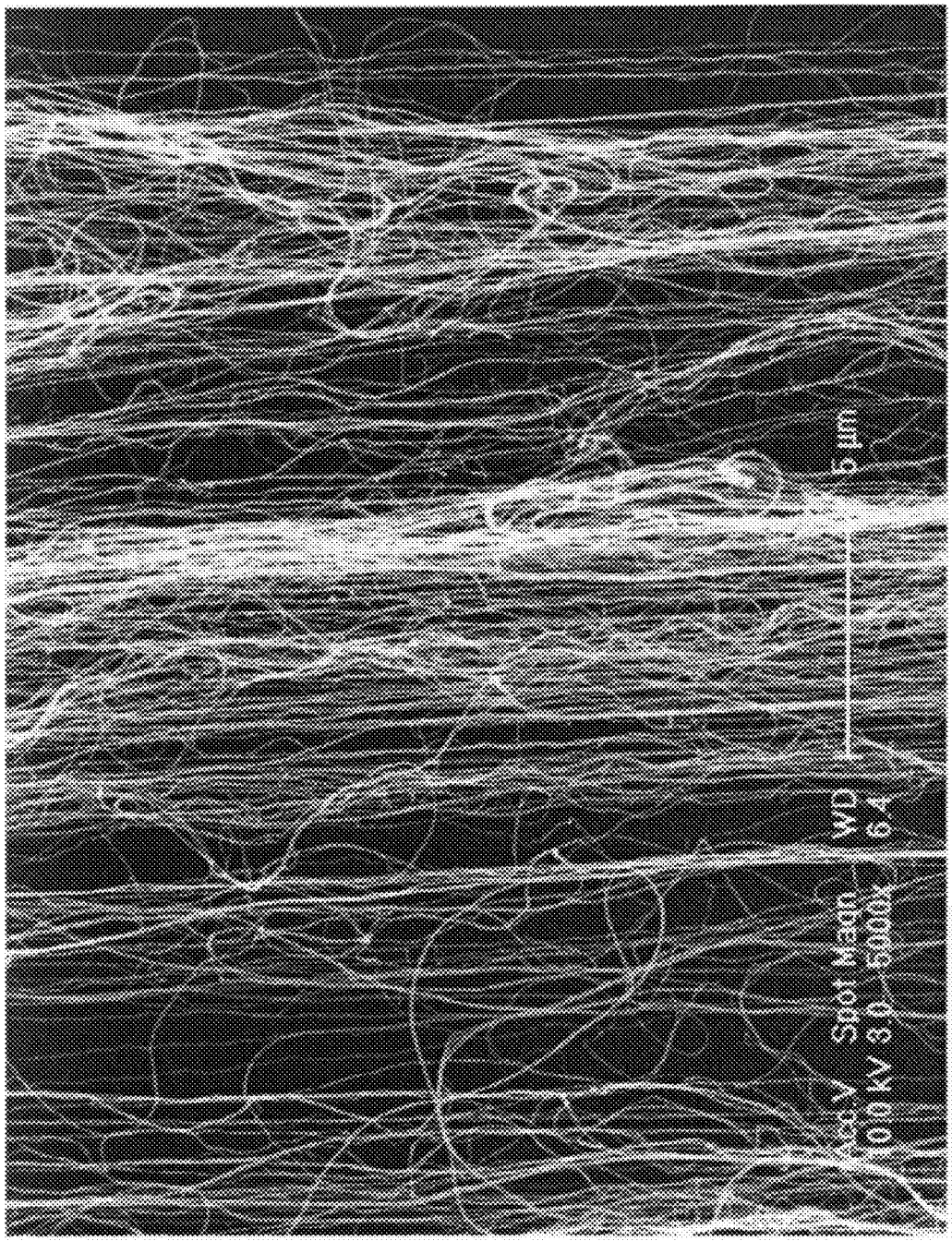
FIG. 3 shows a Scanning Electron Microscope (SEM) image of a carbon nanotube film before the process of laser irradiating.

More specifically, during the pulling process, as a thickness of the carbon nanotube segments is not substantially equal, the thickness of the carbon nanotube film formed by pulling is not substantially equal, and it includes a plurality of bundles with larger diameters. The bundles with larger diameter have low light transmittance, and as a result, the carbon nanotube films 118 also have low light transmittance (less than 75%). The SEM image of the carbon nanotube film made by the pulling method is referred to FIG. 3.

A width of the carbon nanotube film 118 depends on the size of the carbon nanotube array 116. A length of the carbon nanotube film 118 is arbitrary. In the present embodiment, when the size of the substrate 114 is 4 inches, the width of the carbon nanotube film 118 approximately ranges from 1 to 10 centimeters, and the thickness of the carbon nanotube film 118 approximately ranges from 0.01 to 100 microns.

In the first embodiment, a first platform 120 and a second platform 130 are located in sequence along the pulling direction. A first bar 124 is located on a surface of the first platform 120. A second bar 134 is located on a surface of the second platform 130. The first bar 124 and the second bar 134 are cuboids and can be taken down from the first platform 120 and the second platform 130, respectively. A width of the first bar 124 and the second bar 134 is wider than or equal to the width of the carbon nanotube film 118. The first bar 124 and the second bar 134 are made of glass, ceramics, resin, metal, or quartz. In the present embodiment, the first bar 124 and the second bar 134 are made of metal.

Step (b) is executed in an atmosphere comprising of oxygen therein. In the present embodiment, step (b) is executed in an ambient atmosphere.

Step (b) includes the following substeps: (b1) fixing the carbon nanotube film 118; and (b2) moving the laser device 140 at an even/uniform speed to irradiate the carbon nanotube film 118, thus acquiring a transparent carbon nanotube film.

In step (b1), the carbon nanotube film 118 pulled out from the super-aligned carbon nanotube array 116 can be adhered to the first bar 124 and the second bar 134 directly.

In step (b2), the laser device 140 includes at least one laser 142. When the laser device 140 includes a laser 142, as the laser 142 irradiates the carbon nanotube film 118, the laser is focused on the surface of carbon nanotube film 118, wherein the diameter of a laser irradiating pattern of the carbon nanotube film 118 ranges from 1 micron to 5 millimeters. When the laser device 140 includes a plurality of lasers 142, it forms a strap-shaped laser irradiating area 144. A length of the strap-shaped laser irradiating area 144 is greater than or equal to the width of the carbon nanotube film 118. A width of the strap-shaped laser irradiating area 144 ranges from 1 micron to 5 millimeters.

Figure 4:
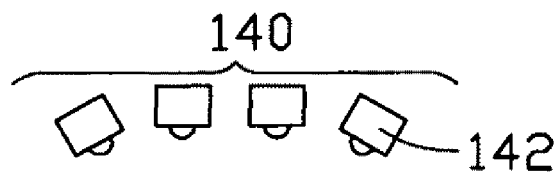
FIG. 4 shows the carbon nanotube film irradiating by moving laser device.
Figure 4:
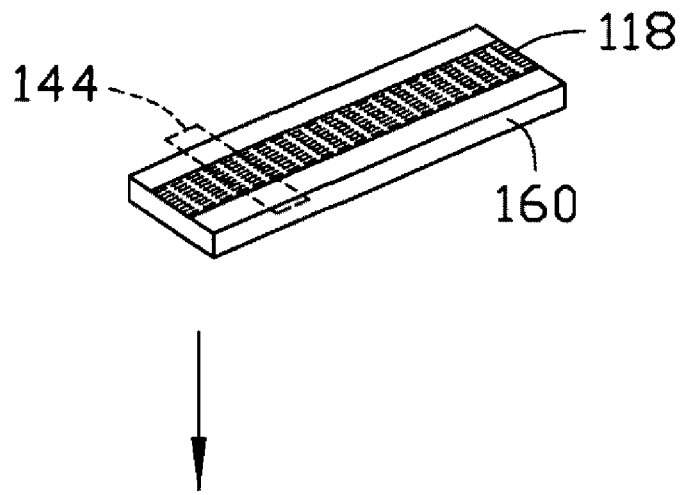
Figure 4:
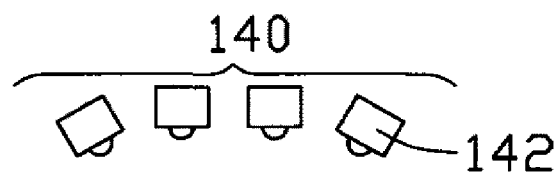
Figure 4:
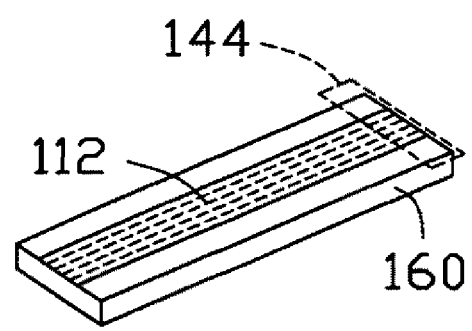

Step (b2) can be executed by two methods. The first method for irradiating the carbon nanotube film 118 is executed by moving the laser device 140 from the first bar 124 to the second bar 134 at an even/uniform speed, and irradiating the carbon nanotube film 118 between the first bar 124 and the second bar 134 in the environment of atmosphere, thus acquiring a transparent carbon nanotube film 112. Referring to FIG. 4, the second method for irradiating the carbon nanotube film 118 is executed by moving the laser device 140, and irradiating the carbon nanotube film 118 adhered to the surface of a mobile substrate 160, thus acquiring a transparent carbon nanotube film 112. The carbon nanotube film 118 can be adhered on the surface of the mobile substrate 160. A width of the mobile substrate 160 is wider than or equal to the width of the carbon nanotube film 118. The length of the mobile substrate 160 is arbitrary. A material of the mobile substrate 160 is selected from a group consisting of metal, plastic, glass, resin, and quartz. In the present embodiment, the material of the mobile substrate 160 is resin. The carbon nanotubes absorb energy from laser irradiation and the temperature thereof is increased. The carbon nanotube bundles with larger diameters will absorb more energy and be destroyed. When the carbon nanotube bundles in the carbon nanotube film 118 are destroyed due to absorbing too much energy from the laser irradiation, a transparent carbon nanotube film 112 will be acquired. In the present embodiment, after laser irradiation, the light transmittance of the transparent carbon nanotube film 112 is greater than 75%.

It is to be understood that the ways of laser irradiating are arbitrary. The moving direction of the laser device 140 is parallel or perpendicular to the direction of pulling. For a laser device 140 with a stable power density, the slower the moving speed of the laser device 140, the more carbon nanotube bundles of the carbon nanotube film 118 will be destroyed, and the higher the light transmittance of the transparent carbon nanotube film 112 will be. But if the speed is too slow, the carbon nanotube film 118 will be completely destroyed. In the present embodiment, a power density of the laser 142 is greater than $0.1 \times 10^4$ W/m$^2$, a diameter of the irradiating pattern of the laser approximately ranges from 1 micron to 5 millimeters, wherein a time of laser irradiation is less than 1.8 s. In the present embodiment, the laser 142 is a carbon dioxide laser and the power density of the laser 142 is 30 W. A wavelength of the laser 142 is 10.6 micron. The diameter of the irradiating pattern of the laser is 3 millimeters. A moving speed of the laser device 140 is less than 20 m/s.

Figure 5:
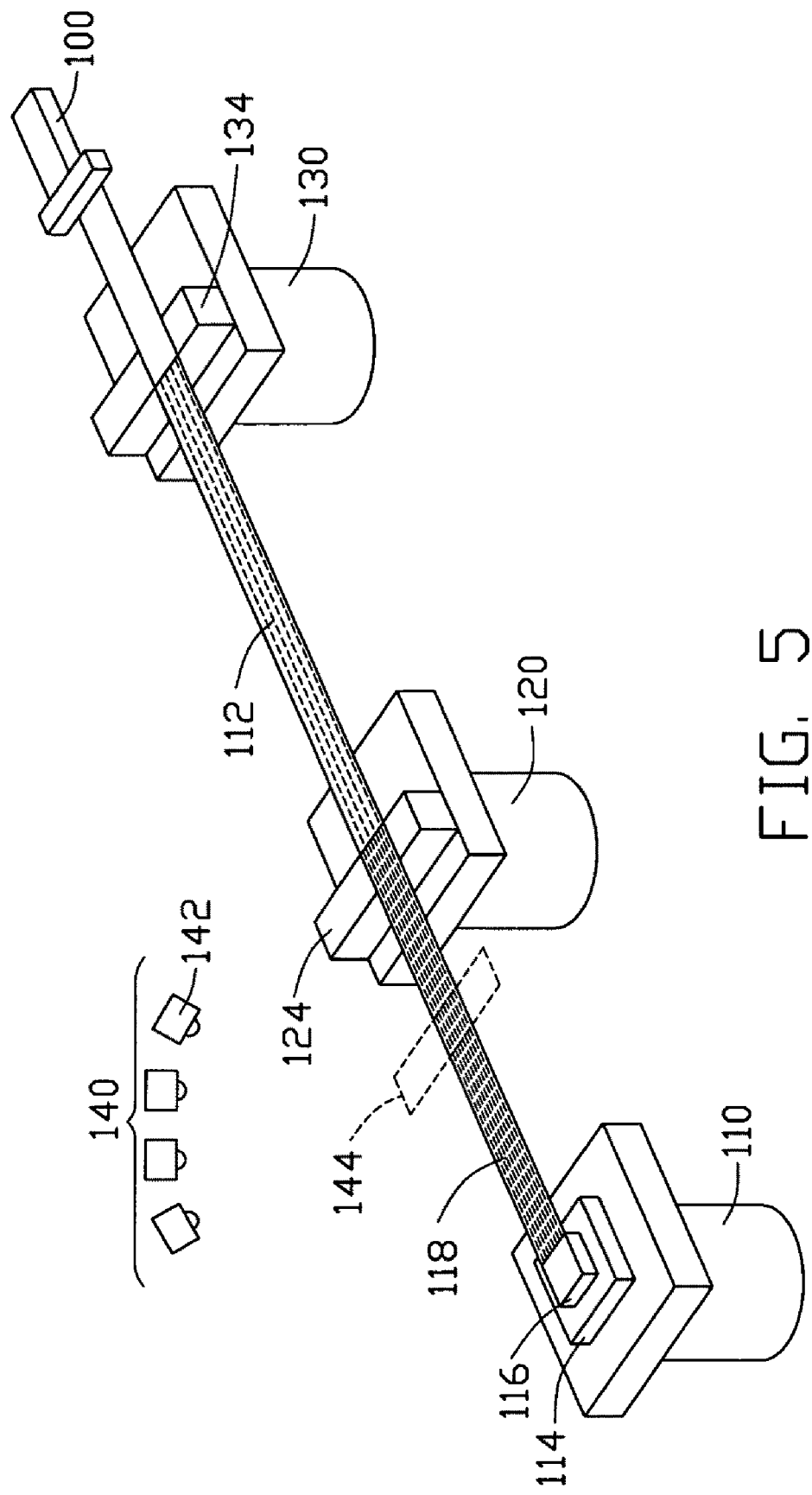
FIG. 5 is a system for making a transparent carbon nanotube film in accordance with the second embodiment.

Referring to FIG. 5, in the second embodiment, step (b) can alternatively include the following substeps: (b1') fixing the laser device 140 to form a strap-shaped laser irradiating area 144; and (b2') moving the carbon nanotube film 118 at an even/uniform speed to pass through the laser irradiation area 144, thus acquiring a transparent carbon nanotube film 112.

In step (b1'), the laser device 140 is fixed over the sample platform 110. A strap-shaped laser irradiating area 144 is formed between the sample platform 110 and the first platform 120. The laser device 140 includes a plurality of lasers 142. The laser strap-shaped irradiating area 144 is a strap-shaped area with a width approximately ranging from 1 micron to 5 millimeters. A length of the strap-shaped laser irradiating area 144 can be greater than or equal to a width of the carbon nanotube film 118.

In step (b2'), a carbon nanotube film 118 is drawn out from the super-aligned carbon nanotube array 116 by a pulling tool 100. The carbon nanotube film 118 stretched by the pulling tool 100 passes through the strap-shaped laser irradiating area 144 at an even/uniform speed. As the carbon nanotube film 118 passes through the laser irradiating area 144, lasers irradiate the carbon nanotube film 118. The slower the speed of the carbon nanotube film 118, the more energy is absorbed by the carbon nanotubes in the carbon nanotube film 118, and the more carbon nanotube bundles with large diameters are destroyed. Subsequently, a transparent carbon nanotube film 112 with a high light transmittance is acquired. However, if the speed is too slow, the carbon nanotube film 118 will be completely destroyed due to absorbing too much energy.

Figure 6:
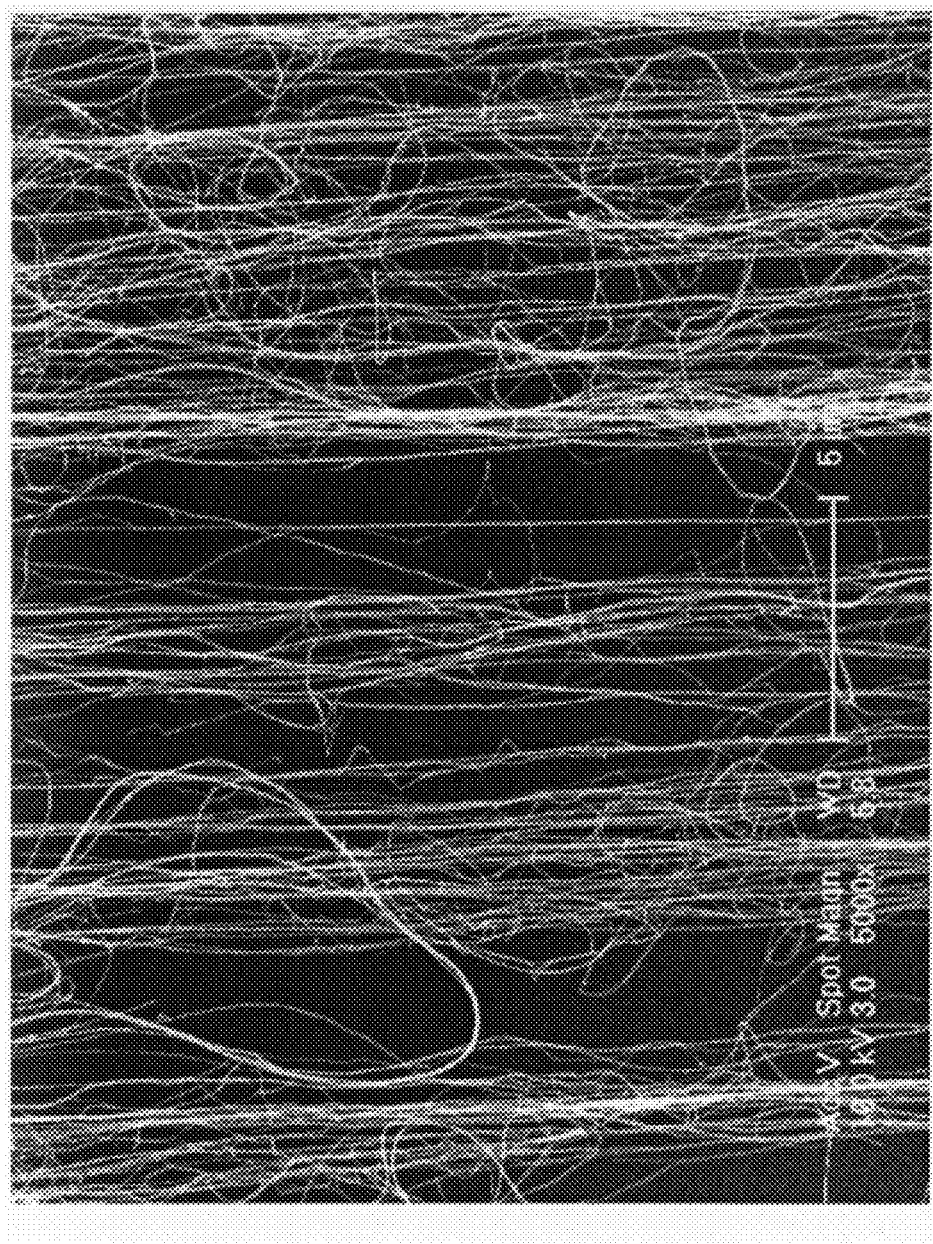
FIG. 6 shows a Scanning Electron Microscope (SEM) image of a transparent carbon nanotube film.

In the present embodiment, the types of the lasers 142 in the laser device 140 can be selected from a group consisting of Gas lasers, Solid-state lasers, Semiconductor lasers, Dye lasers, or any other conventional laser. A power density of the laser is greater than $0.1 \times 10^4$ W/m$^2$, a diameter of the irradiating pattern of the laser approximately ranges from 1 micron to 5 millimeters, and a time of laser irradiation is less than 10 s. In the present embodiment, the laser device 140 includes at least one Gas laser 142. A power density of the laser device 140 is 30 W. A wavelength of the laser device 140 is 10.6 micron. A speed of the carbon nanotube film 118 is less than 20 m/s. A light transmittance of the transparent carbon nanotube film 112 is greater than 75%. In the present embodiment, the light transmittance of the transparent carbon nanotube film 112 is 95%. A SEM image of the transparent carbon nanotube film 112 is referred to FIG. 6.

It is noted that because the carbon nanotubes in the super-aligned carbon nanotube array 116 of step (a1) has a high purity and a high specific surface area, the carbon nanotube film 118 is adhesive. As such, in step (b), the carbon nanotube film 118 can be adhered to the first bar 124, the second bar 134 or the mobile substrate 160 directly.

In the present embodiment, the transparent carbon nanotube film 112 can be snipped, and then repeating step (b) can continuously produce a plurality of transparent carbon nanotube films 112. Also the irradiation process can be performed over if the results obtained are not sufficient.

Compared to conventional technologies, the method for making the transparent carbon nanotube film provided by the present embodiment has the following advantages: firstly, the transparent carbon nanotube film acquired by the method of the present embodiment has good light transmittances. Secondly, the transparent carbon nanotube film can be continuously produced by the method of the present embodiment.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that above description and the claims drawn to a method may include some indication in reference to certain steps. However, the indication used is only to be viewed for identification purposes and not as a suggestion as to an order for the steps.

The invention claimed is:

1. A method for making a transparent carbon nanotube film, the method comprises the following steps:
    (a) obtaining a carbon nanotube film; and
    (b) irradiating the carbon nanotube film by a laser device with a power density greater than $0.1 \times 10^4$ W/m$^2$.

2. The method as claimed in claim 1, wherein in step (a) the carbon nanotube film is obtained by a direct growth method, a flocculating method, a pressing method, or a pulling method.

3. The method as claimed in claim 2, wherein the carbon nanotube film is made by the pressing method and comprises a plurality of carbon nanotubes aligned in a same or different directions.

4. The method as claimed in claim 2, wherein the carbon nanotube film is made by the flocculating method and comprises a plurality of isotropic carbon nanotubes entangled with each other and disorderly distributed therein.

5. The method as claimed in claim 1, wherein step (a) further comprises the following substeps:
    (a1) making a super-aligned carbon nanotube array on a substrate; and
    (a2) pulling the carbon nanotube film from the super-aligned carbon nanotube array with a pulling tool.

6. The method as claimed in claim 1, wherein a laser device comprises at least one laser.

7. The method as claimed in claim 6, wherein the laser device is focused on a surface of the carbon nanotube film, and a diameter of the laser irradiating pattern ranges from 1 micron to 5 millimeters.

8. The method as claimed in claim 6, wherein the laser device comprises a plurality of lasers focused to form a strap-shaped laser irradiating area on the surface of carbon nanotube film, and a width of the strap-shaped laser irradiating area ranges from 1 micron to 5 millimeters.

9. The method as claimed in claim 8, wherein a length of the strap-shaped laser irradiating area is greater than a width of the carbon nanotube film.

10. The method as claimed in claim 6, wherein the lasers in the laser device can be selected from a group consisting of Gas lasers, Solid-state lasers, Semiconductor lasers, and Dye lasers.

11. The method as claimed in claim 1, wherein step (b) further comprises the following steps:
(b1) fixing the carbon nanotube film; and
(b2) causing relative movement between the laser device and the carbon nanotube film to irradiate the carbon nanotube film.

12. The method as claimed in claim 11, wherein the (b2) is executed by moving the laser device to irradiate the carbon nanotube film.

13. The method as claimed in claim 12, wherein the speed of the laser device is less than 20 m/s.

14. The method as claimed in claim 12, wherein a power density of the laser device is greater than $0.1 \times 10^4$ W/m$^2$, and a time of irradiating is less than 10 s.

15. The method as claimed in claim 1, wherein step (b) further comprises the following substeps:
(b1') fixing the laser device to form a strap-shaped laser irradiating area; and
(b2') moving the carbon nanotube film at an even/uniform speed to pass through the laser irradiating area, thus acquiring the transparent carbon nanotube film.

16. The method as claimed in claim 15, wherein a power density of the laser device is greater than $0.1 \times 10^4$ W/m$^2$, and a time of irradiating is less than 10 s.

17. The method as claimed in claim 15, wherein a speed of the carbon nanotube film is less than 20 m/s.

18. The method as claimed in claim 1, wherein step (b) is executed in an atmosphere comprising of oxygen.

19. The method as claimed in claim 1, irradiating the carbon nanotube film until the light transmittance is improved to be greater than 75%.

* * * * *